United States Patent [19]
Horvath et al.

[11] Patent Number: 5,488,924
[45] Date of Patent: Feb. 6, 1996

[54] HOPPER FOR USE IN CHARGING SEMICONDUCTOR SOURCE MATERIAL

[75] Inventors: Julian Horvath, Spartanburg; Dennis G. Jones, Taylors; Jane E. Polett, Spartanburg, all of S.C.

[73] Assignee: MEMC Electronic Materials, St. Peters, Mo.

[21] Appl. No.: 163,661

[22] Filed: Dec. 6, 1993

[51] Int. Cl.[6] .................................................. C30B 35/00
[52] U.S. Cl. .............................. 117/208; 117/18; 117/214
[58] Field of Search ................................ 117/18, 31, 33, 117/208, 214, 912; 23/273

[56] References Cited

U.S. PATENT DOCUMENTS

| | | | |
|---|---|---|---|
| 2,893,847 | 7/1959 | Schweickert et al. | 23/273 |
| 3,337,303 | 8/1967 | Lorenzini | 23/273 |
| 3,679,370 | 7/1972 | Czeck et al. | 117/208 |
| 4,036,595 | 7/1977 | Lorenzini et al. | 23/273 |
| 4,134,785 | 1/1979 | Lavigna et al. | 156/601 |
| 4,249,988 | 2/1981 | Lavigna et al. | 156/605 |
| 4,454,096 | 6/1984 | Lorenzini et al. | 422/249 |
| 4,710,260 | 12/1987 | Witter et al. | 156/605 |
| 4,894,206 | 1/1990 | Yamashita et al. | 422/249 |
| 4,936,949 | 6/1990 | Kida et al. | 156/617.1 |
| 4,981,549 | 1/1991 | Yamashita et al. | 156/620.4 |
| 5,009,862 | 4/1991 | Kida et al. | 422/249 |
| 5,034,200 | 7/1991 | Yamashita et al. | 422/249 |
| 5,067,989 | 11/1991 | Yokota et al. | 148/33 |
| 5,087,321 | 2/1992 | Kamio et al. | 156/608 |
| 5,087,429 | 2/1992 | Kamio et al. | 422/249 |
| 5,131,974 | 7/1992 | Oda et al. | 156/601 |
| 5,288,366 | 2/1994 | Holder | 117/33 |
| 5,290,395 | 3/1994 | Matsumoto et al. | 117/18 |

FOREIGN PATENT DOCUMENTS 2007119  4/1992  Japan ................................. 117/208

OTHER PUBLICATIONS

George Fiegl and Walter Torbet of Siltec Corp. for NASA's Jet Propulsion Laboratory, "Two–Crucible Czochralski Process", NASA Tech Briefs, Spring 1984.

Electronics, "Silicon Furnace Gets Multiple Charges", Jun. 22, 1978, pp. 44–45.

W. Zulehner et al., "Czochralski–Grown Silicon", Crystals; Growth, Properties, and Applications 8, 1982, pp. 99–104.

DNS Electronic Materials, Merano, Italy, Blueprint, one page, 1990.

Primary Examiner—R. Bruce Breneman
Assistant Examiner—Felisa Garrett
Attorney, Agent, or Firm—Senniger, Powers, Leavitt & Roedel

[57] ABSTRACT

A hopper is sized and shaped for reception in a crystal pulling apparatus for use in charging semiconductor source material to a crucible of the crystal pulling apparatus. The crystal pulling apparatus includes a pulling chamber, a growth chamber, an isolation valve operable to seal the growth chamber from the pulling chamber, and a crucible in the growth chamber. The hopper includes a bin constructed for containing a quantity of semiconductor source material. The bin has an opening in its bottom for delivery of the semiconductor source material from the bin to the crucible. A stopper constructed for closing the opening to prohibit passage of semiconductor source material from the bin is moved by a stopper actuating mechanism between a closed position and an open position. A connector attached to the hopper is constructed for temporarily mounting the hopper in the crystal pulling apparatus.

7 Claims, 8 Drawing Sheets

HOPPER FOR USE IN CHARGING SEMICONDUCTOR SOURCE MATERIAL

BACKGROUND OF THE INVENTION

This invention relates generally to temporary storage receptacles and more particularly to a hopper for charging semiconductor source material in a Czochralski crystal pulling apparatus.

In operation of the Czochralski method of single crystal growth, a quantity of source material is formed in a crucible by melting solid semiconductor source material maintained in an inert environment at a vacuum pressure. As the crystal is grown, the source material is drawn off from the melt so that upon completion of the growth of one crystal, there is not enough semiconductor source material remaining in the crucible to grow a second crystal.

In the past, the provision of more source material from the second crystal was accomplished by shutting down the crystal pulling apparatus and bringing its interior to the room conditions. A new crucible with solid semiconductor source material in it was placed in the crystal pulling apparatus. The crystal pulling apparatus was then closed, the crucible environment was adjusted as needed for room conditions, and the source material was heated to form a new melt. This process was very time consuming, requiring many hours between successive crystal growths. In most cases, replacement of the melt as described required use of semiconductor source material in the more expensive form of blocks for melting.

One alternative to replacing the melt in the crystal pulling apparatus, is to replenish the melt (i.e., "batch recharge") by the addition of source material to the crucible, often in solid form, without shutting down the crystal pulling apparatus. Presently, temporary storage receptacles for semiconductor source material are located on the exterior of the crystal pulling apparatus and permanently attached to the crystal pulling apparatus. Semiconductor source material is delivered through a special opening in a wall of the crystal pulling apparatus. Expensive valving at the special opening is required to avoid loss of the environment and contamination of the melt when source material is added. Commercial producers of semiconductor material have been faced with undesirable choices if they wish to employ batch recharge so that more crystals may be grown before the crystal pulling apparatus must be shut down to replace the melt. They must either purchase a new crystal pulling apparatus having the permanently attached semiconductor source material storage receptacle, or accept radical and expensive modification of their existing crystal pulling apparatus.

SUMMARY OF THE INVENTION

Among the several objects and features of the present invention may be noted the provision of a hopper for use in charging semiconductor source material to a crucible of a crystal pulling apparatus which requires no permanent fixture to the crystal pulling apparatus; the provision of such a hopper which can be used with existing crystal pulling apparatus without modification to the crystal pulling apparatus; the provision of such a hopper which is portable for servicing several crystal pulling apparatus; the provision of such a hopper which guards the semiconductor source material contained therein from contamination; and the provision of such a hopper which is relatively inexpensive to manufacture.

Further among the objects and features of the present invention may be noted the provision of a method for operating a crystal pulling apparatus in which multiple crystals are grown from a replenished melt without shutting down the apparatus; the provision of such a method which increases throughput in monocrystal production; the provision of such a method which permits greater employment of relatively inexpensive semiconductor source material; the provision of such a method which employs existing features of the crystal pulling apparatus for recharging the crucible; and the provision of such a method which can be carried out efficiently.

A hopper constructed according to the principles of the present invention may be used for charging semiconductor source material to a crucible of a crystal pulling apparatus of the type which produces monocrystals by the Czochralski method. The crystal pulling apparatus includes a pulling chamber, a growth chamber, an isolation valve operable to seal the growth chamber from the pulling chamber, and a crucible in the growth chamber. Generally, the hopper is sized and shaped for reception in the crystal pulling apparatus, and comprises a bin having an opening in its bottom for delivery of the semiconductor source material from the bin to the crucible. A stopper constructed for closing the opening to prohibit passage of semiconductor source material from the bin can be moved by a stopper actuating mechanism between a closed position and an open position. A connector attached to the hopper is constructed for temporarily mounting the hopper in the crystal pulling apparatus.

A method for operating a crystal pulling apparatus of the type described above generally comprises the steps of opening the crystal pulling chamber to the exterior of the crystal pulling apparatus, and inserting a hopper containing semiconductor source material into the crystal pulling chamber. The hopper is connected to the crystal pulling apparatus, and the crystal pulling chamber is closed thereby to substantially seal it from the environment exterior of the crystal pulling apparatus. An environment in the pulling chamber substantially equivalent to the environment of the growth chamber is established before opening the isolation valve to expose the growth chamber to the pulling chamber. Semiconductor source material is released from the hopper into the crucible.

Other objects and features of the present invention will be in part apparent and in part pointed out hereinafter.

Figure 9:
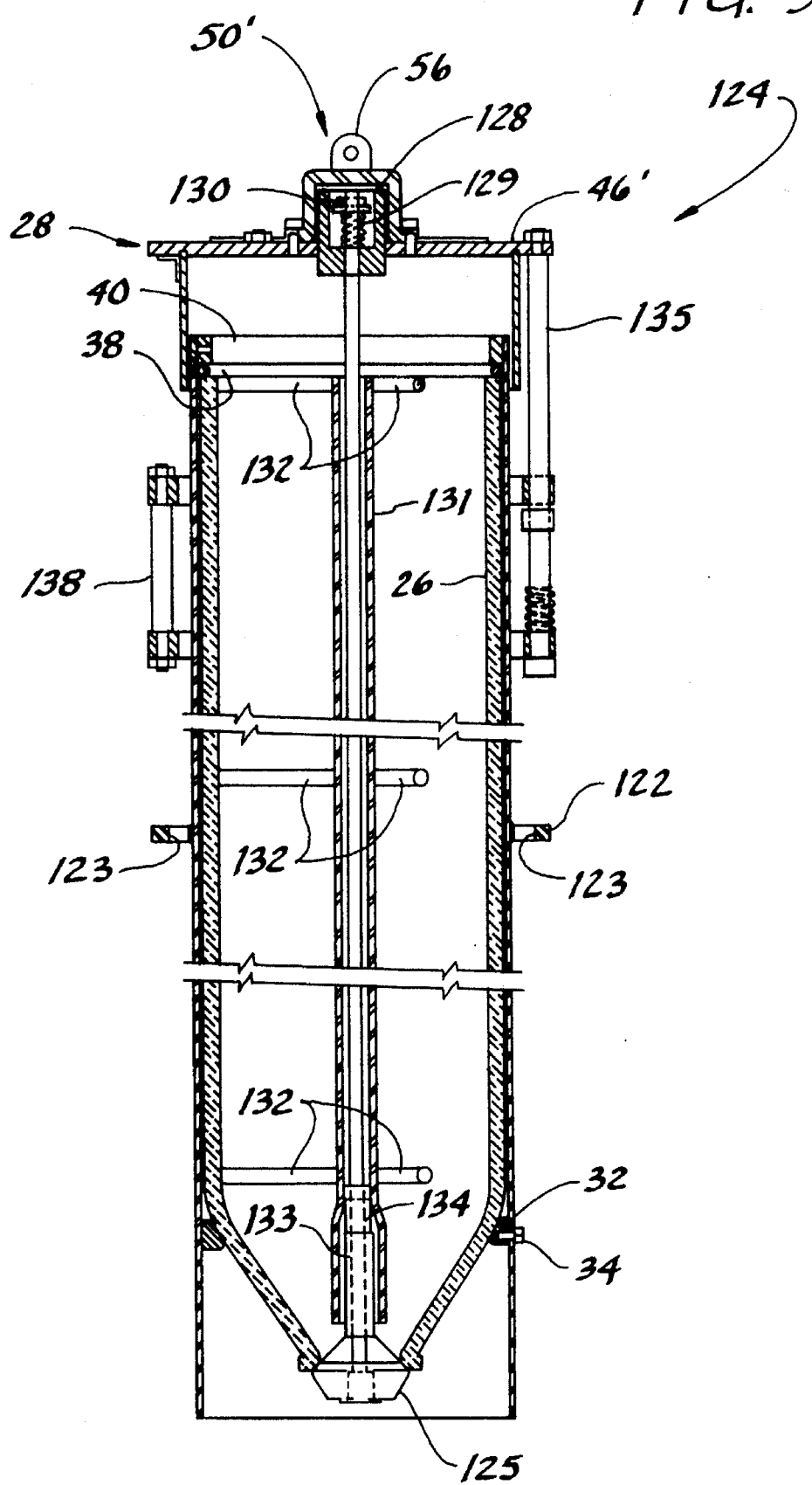
Figure 11:
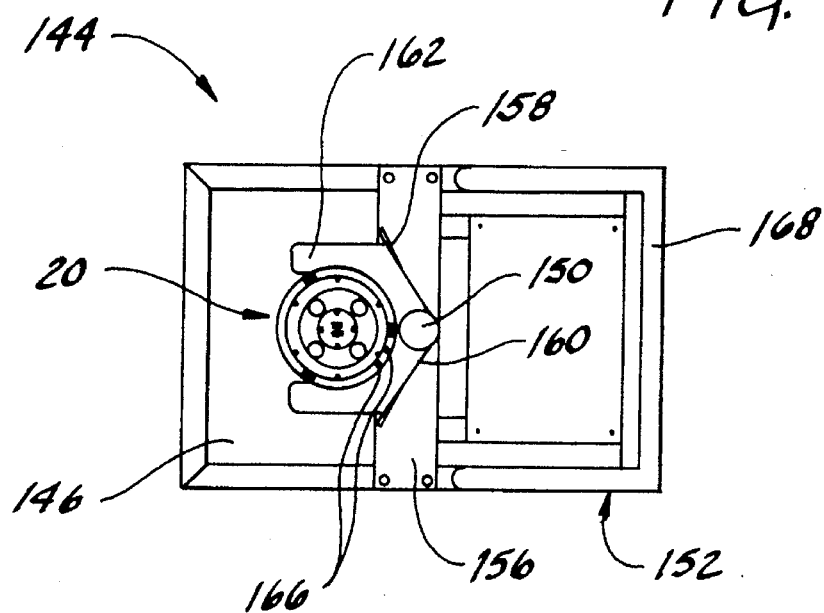
Figure 10:
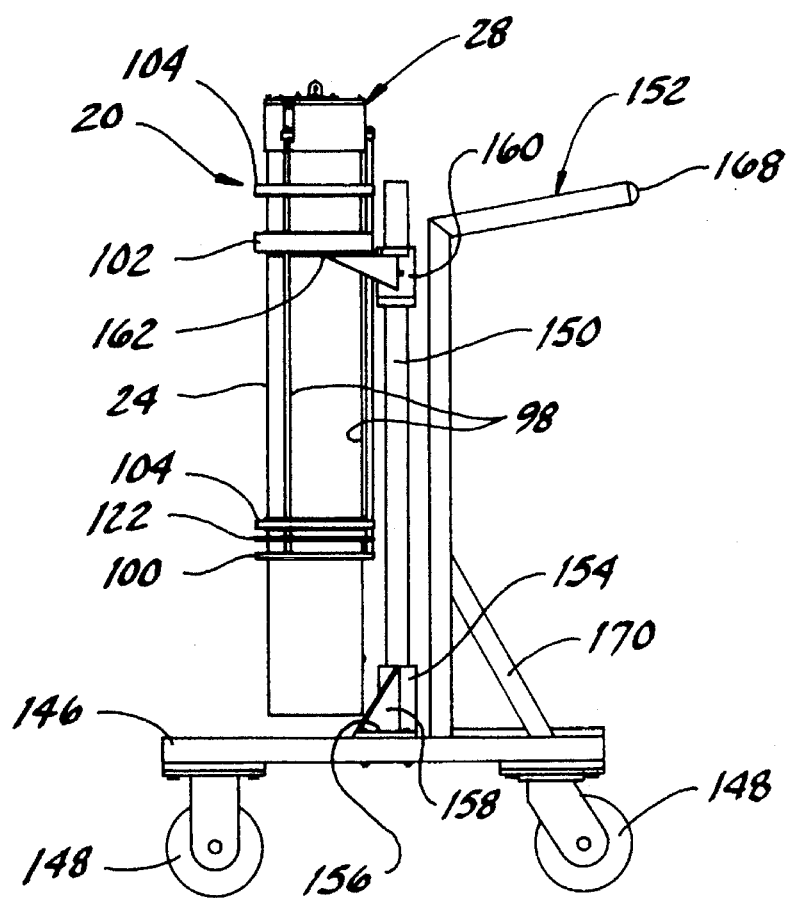

FIG, 8 is an elevation of a lift ring of the hopper;

FIG. 9 is a vertical section of a hopper of a second embodiment of the present invention;

FIG. 10 is an elevation of the hopper in a carrier used for transporting the hopper;

FIG. 11 is a top plan view of the hopper and carrier of FIG. 10; and

Figure 12:
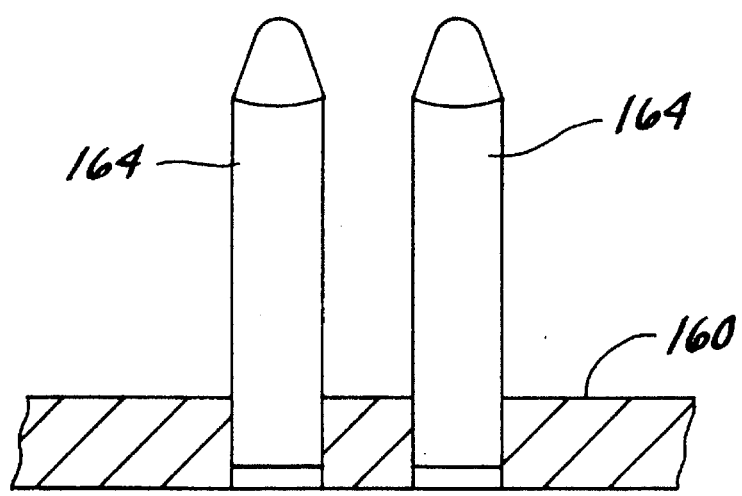

FIG. 12 is a greatly enlarged fragmentary view of the carrier showing pins for holding the hopper on the carrier.

Corresponding reference characters indicate corresponding parts throughout the several views of the drawings.

DETAILED DESCRIPTION OF THE PREFERRED EMBODIMENTS

Figure 1:
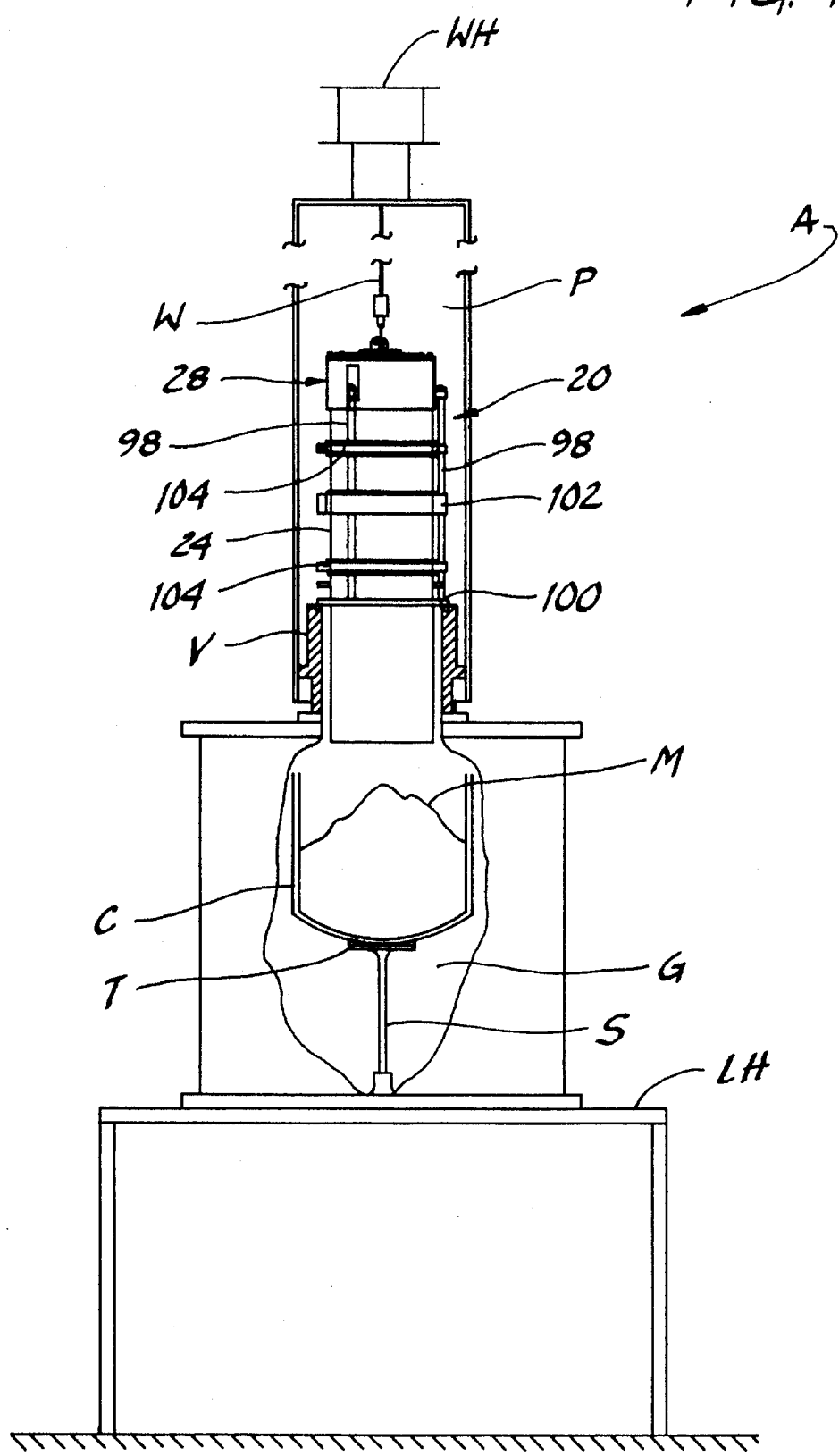
FIG. 1 is a schematic elevation of a crystal pulling apparatus with parts broken away to show a hopper of the present invention disposed therein.

Referring now to FIG. 1 of the drawings, a hopper (designated generally by reference numeral 20) of the present invention is shown as used to charge (or recharge) a crucible C of a crystal pulling apparatus (generally indicated at A) with semiconductor source material. The crystal pulling apparatus A is shown schematically in FIG. 1, the details of its construction being well known to those of ordinary skill in the art. Generally, the crystal pulling apparatus A includes a pulling chamber P, a growth chamber G, an isolation valve V operable to seal the growth chamber from the pulling chamber, and the crucible C located in the growth chamber. In FIG. 1, the pulling chamber P is shown in vertical section, while a portion of the wall of the growth chamber G is removed to show the crucible C. The crucible C rests on a turntable T having a shaft extending down into a lower housing LH of the apparatus containing machinery (not shown) of the apparatus. A pull wire W for pulling a monocrystal out of melt of semiconductor source material in the crucible C extends down out of a winch housing WH which contains a winch mechanism (not shown) operable to let out and reel in the pull wire.

Figure 2:
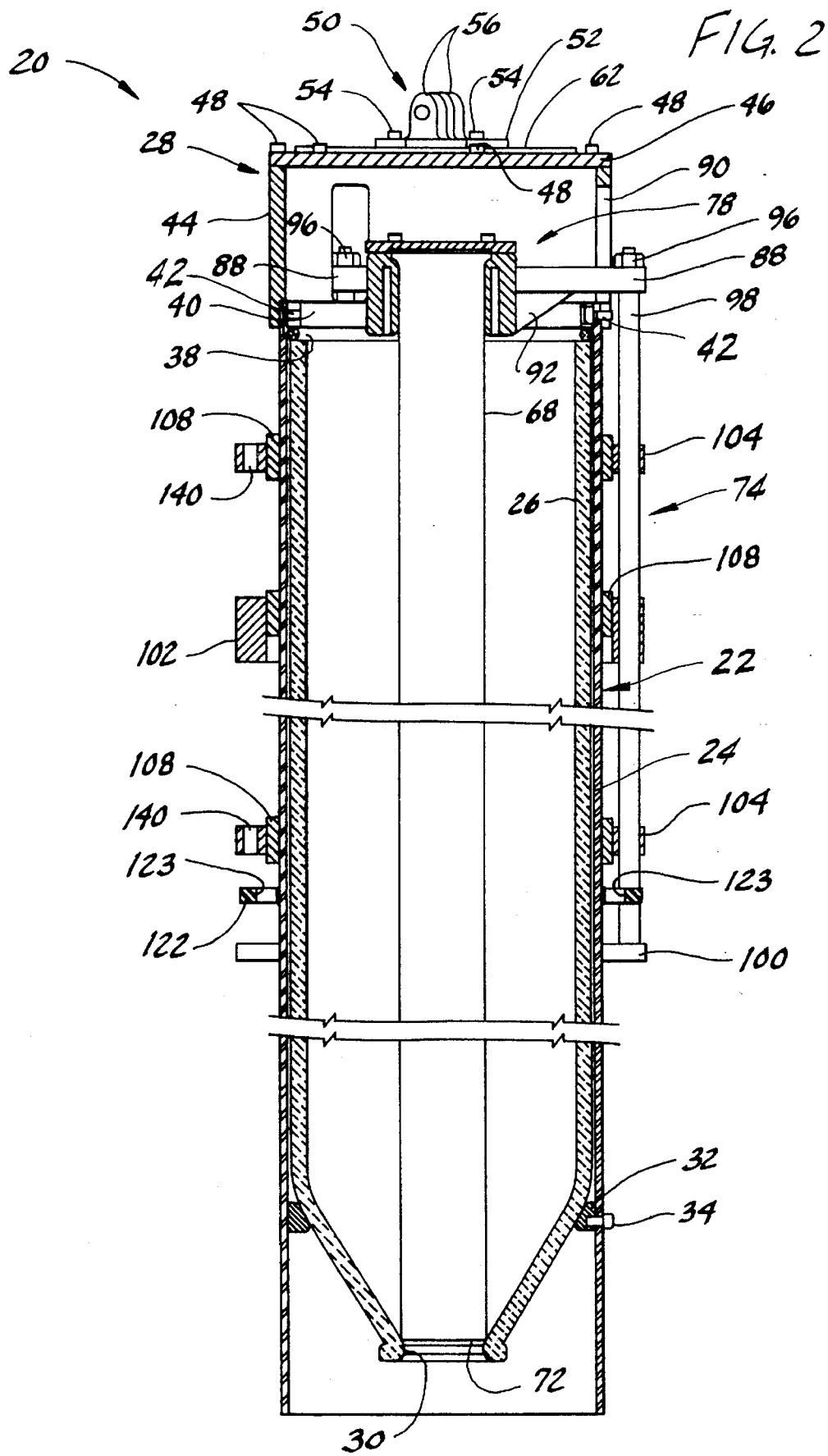
FIG. 2 is a vertical section of the hopper.
Figure 3:
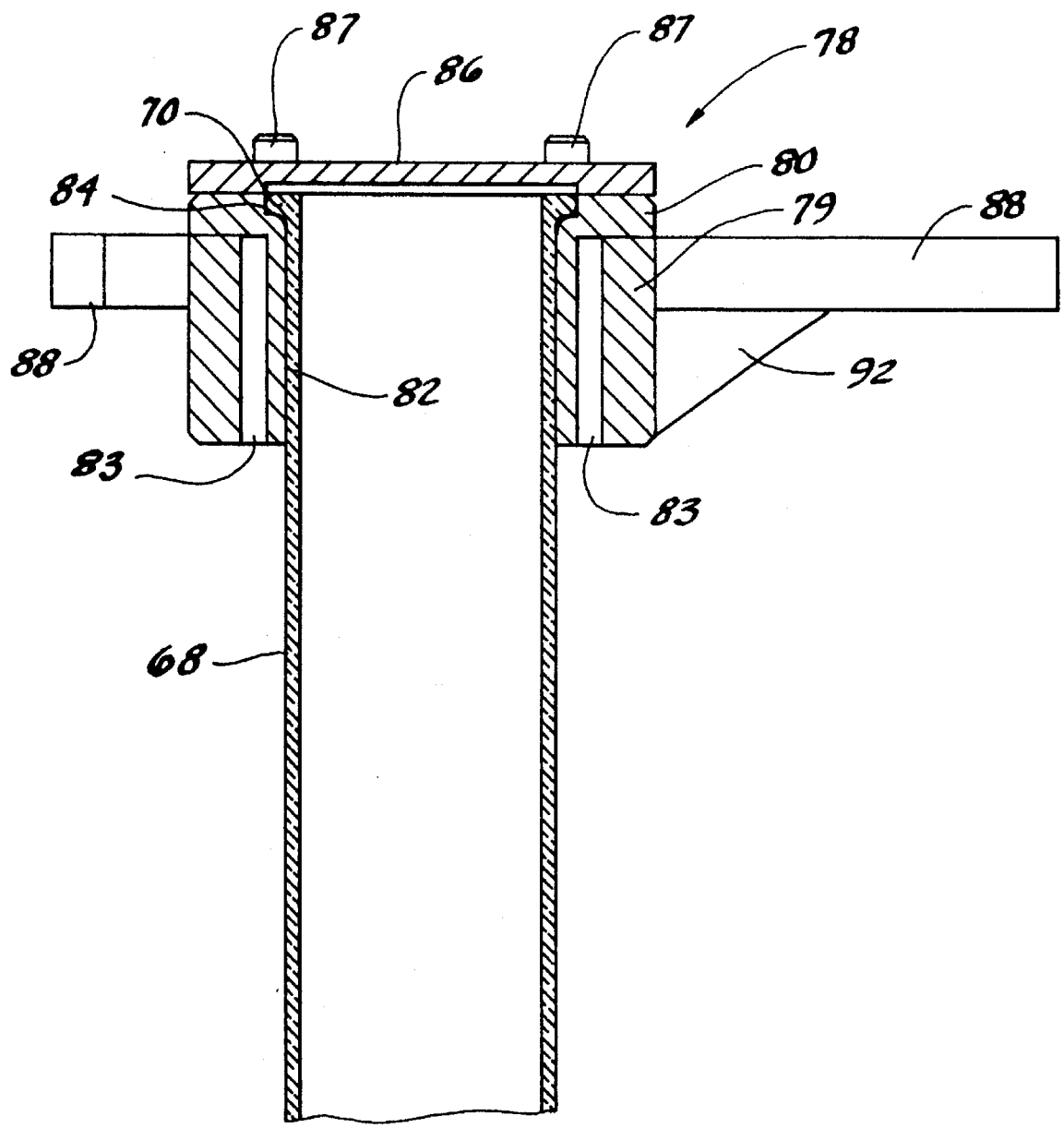
FIG. 3 is an enlarged fragmentary view of the hopper of FIG. 2 showing a stop tube and stop tube lifting bracket of the hopper.

The hopper 20 is sized and shaped for reception entirely within the pulling chamber P of the crystal pulling apparatus A. As shown in FIG. 2, the hopper 20 includes a bin, indicated generally at 22, having a generally tubular, rigid sleeve 24 with open upper and lower ends, a liner 26 disposed within the sleeve and a cap, generally indicated at 28, covering the open upper end of the sleeve. The sleeve 24 and cap 28 are made of a strong, corrosion resistance material, such as stainless steel, to provide strength to the hopper 20, and the liner 26 is made of a material, such as quartz, which will not contaminate the semiconductor source material. The liner 26 is generally tubular in shape, but has a funnel-shaped lower end with an opening 30 through which semiconductor source material is delivered to the crucible C. A lower, stainless steel retainer ring 32 bolted by fasteners 34 (only one is shown) to the sleeve 24 on the interior thereof engages the liner 26 adjacent its lower end and holds the liner in the sleeve. The open upper end of the liner 26 engages an annular gasket 38, made of red silicon rubber or other suitable material, clamped against the upper end by an upper, stainless steel retainer ring 40. The upper retainer ring 40 is secured on the interior of the sleeve by fasteners 42 passing through the sleeve and the cap 28. The gasket 38 cushions the liner 26 during transport and protects the liner from breakage which might otherwise be caused by different amounts of thermal expansion between the liner and the sleeve 24. Thus, the liner 26 is held securely between the upper and lower retainer rings 32, 40.

Figure 4:
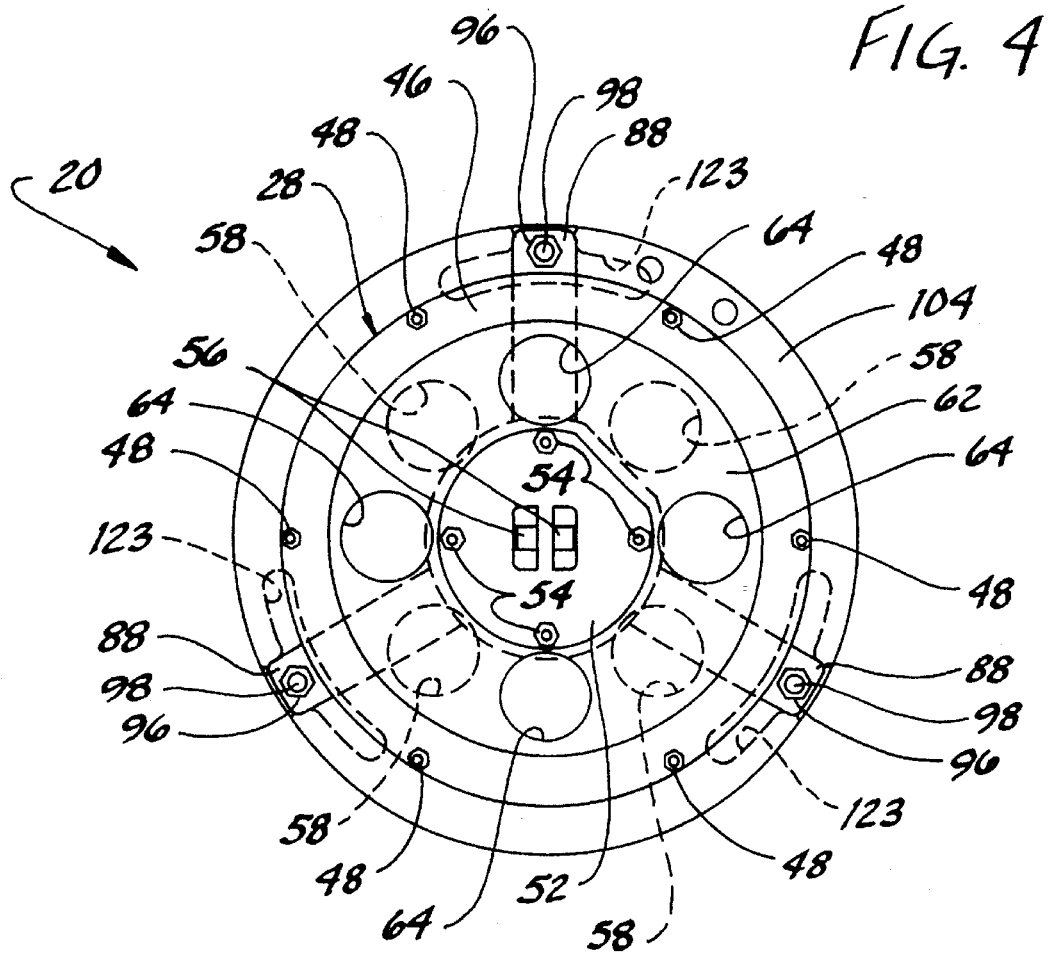
FIG. 4 is a top plan view of the hopper.

The cap 28 includes a tubular side wall 44 and a circular top plate 46 connected by fasteners 48 to the side wall and closing the open upper end of the side wall. A connector, indicated generally at 50, includes a base 52 which is connected by fasteners 54 to the top plate 46, and a pair of eyelets 56 projecting upwardly from the base which are used to hang the hopper 20 on the pull wire W of the crystal pulling apparatus, as described more fully below. As shown in FIG. 4, the top plate 46 has four openings 58 located in a central recessed portion of the top plate. An annular cover plate 62 received in the central recessed portion has around the base 52 of the connector 50, four analogous openings 64. By turning the cover plate 62 relative to the top plate 46 from its closed position (as illustrated in FIG. 4) to bring the openings of the top plate and cover plate (58, 64) into registration, communication is provided to the interior of the hopper 20 for filling it with a quantity of semiconductor source material.

A stopper tube 68 extending through the center of the hopper 20 is constructed for closing the opening 30 at the lower end of the liner 26 to hold the semiconductor source material in the hopper. The stopper tube 68 is a hollow quartz tube having a radially outwardly flaring lip 70 at its upper end and a beveled lower end 72 adapted for face to face contact with the interior wall of the liner 26, as shown in FIG. 2, for stopping the opening 30 at the lower end of the liner. To raise the stopper tube 68 to the open position, in which the opening 30 in the liner is unblocked and semiconductor source material is free to fall through the opening into the crucible C of the crystal pulling apparatus, a stopper actuating mechanism, generally indicated at 74, is provided. The source material added to the crucible is schematically illustrated by the pile M of source material in the crucible C in FIG. 1.

The stopper actuating mechanism 74 includes a bracket, generally indicated at 78, comprising a center ring 79 and an annular bushing 80 received in and fastened to the center ring. The bushing 80 has a central opening 82 through which the stopper tube 68 is received (FIGS. 2–5). The space 83 between the center ring 79 and bushing 80 permits adjustment of their relative positions for purposes of centering the stopper tube 68 on the opening 30 of the liner 26. Around the central opening 82 at the upper end of the bushing 80 a shoulder 84 is formed which bears the outwardly flaring lip 70 of the stopper tube 68 (FIG. 3) for supporting the stopper tube. A retainer plate 86 is attached by bolts 87 to the top of the center ring 79 over the upper end of the bushing 80 secures the stopper tube 68 in the holding member. Three arms 88 (FIG. 5) attached to the center ring 79 extend outwardly from the center ring through slots 90 (FIG. 2) in the cap 28 which are elongated in a vertical direction to permit motion of the arms 88 in a vertical direction relative to the cap. Gussets 92 connected to the undersides of the arms 88 and to the center ring 79 strengthen the arms for lifting the stopper tube 68.

Figure 5:
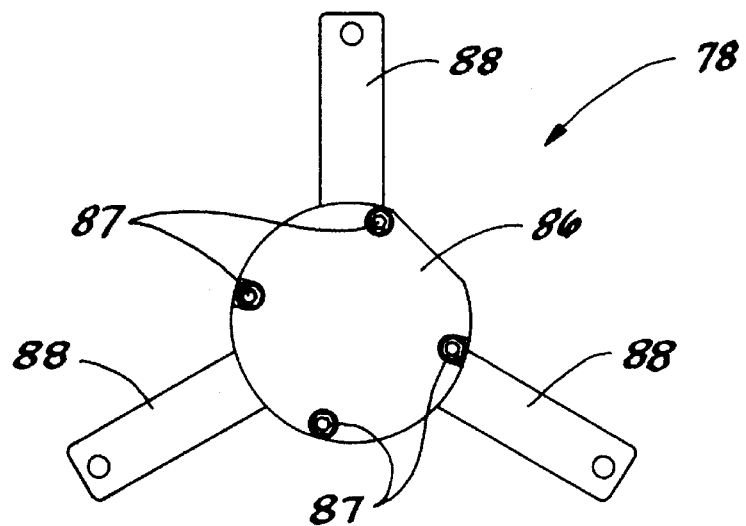
FIG. 5 is a top plan view of the lifting bracket.
Figure 6:
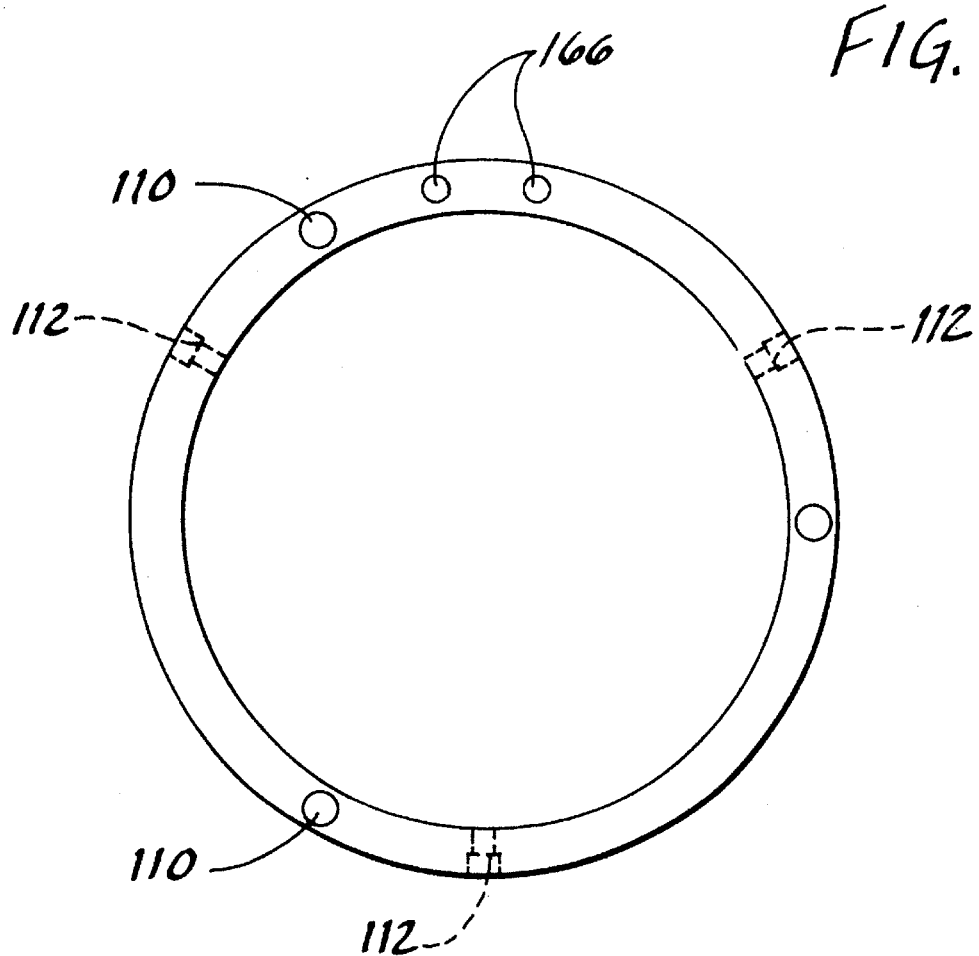
FIG. 6 is an elevation of a hopper support ring.

The distal ends of the arms 88 of FIG. 5 the lifting bracket 78 are connected by nuts 96 threaded on the upper ends of lifter rods 98, which extend down from the arms to a lift ring 100 extending around the exterior of the sleeve 24. Between the lift ring 100 near the lower end of the hopper 20 and the arms 88 of the lifting bracket 78, the lift rods 98 extend through a hopper support ring 102 and two lifter rod guide rings 104 on opposite sides of the hopper support ring. The hopper support ring 102 and guide rings 104 are connected by fasteners (not shown) to respective bands 108 of stainless steel welded onto the exterior of the sleeve 24. As shown in FIG. 6, the hopper support ring 102 has three holes 110 through which the lifter rods 98 are slidably received, and counterbored radial passages 112 which receive fasteners for connecting the hopper support ring to the sleeve 24 of the hopper. The hopper support ring 102 is thicker than the rod guide rings 104 for use in transporting the hopper 20 outside of the crystal pulling apparatus A, as described more fully below.

Figure 7:
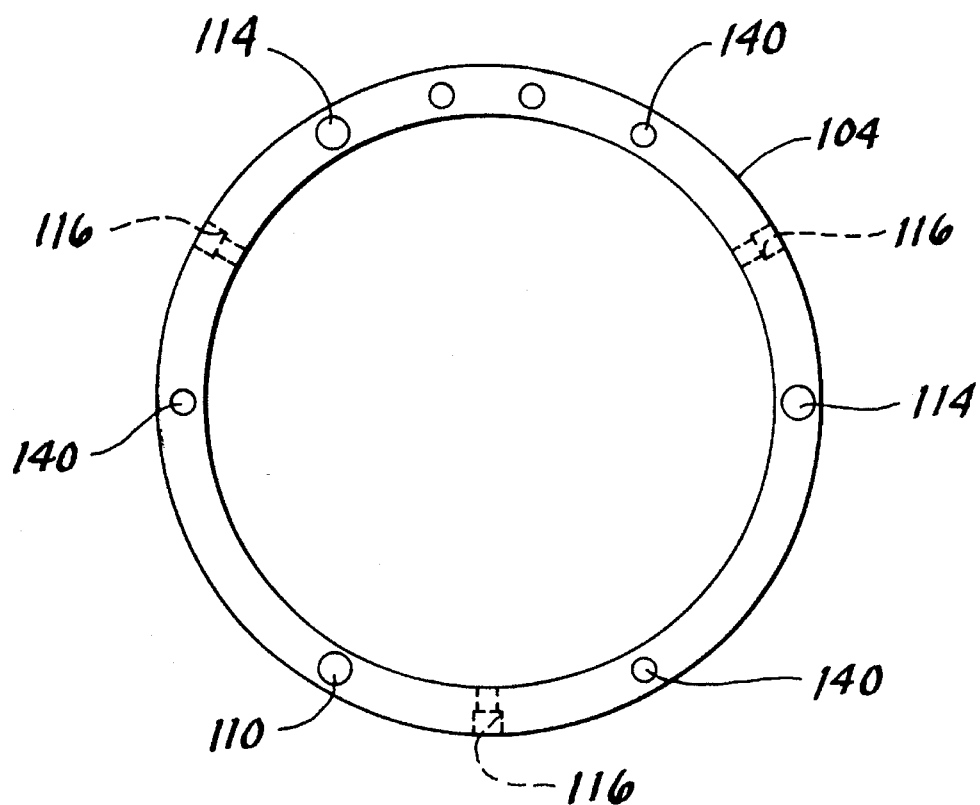
FIG. 7 is an elevation of a lifter rod guide ring of the hopper.
Figure 8:
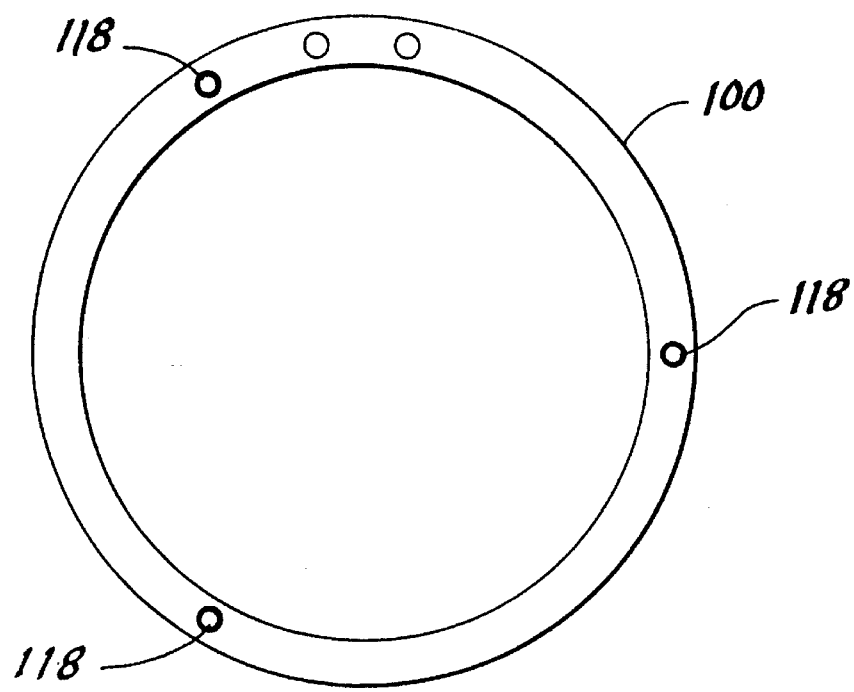

As shown in FIG. 7, the lifter rod guide rings 104 each have three holes 114 for slidably receiving the lifter rods 98 and counterbored radial passages 116 for receiving fasteners to connect the ring to the sleeve 24. The lift ring 100 (FIG. 8) has three holes 118, smaller than the holes (110, 114) of the support ring and the guide rings, which are threaded and receive the lower ends of the lifter rods 98 for connection of the lifter rods to the lift ring 100. A stop ring 122 integral with the sleeve 24 is engageable with the lift ring 100 to define the upper limit of motion of the lift ring. Thus, it may be seen that an upwardly directed force against the lift ring 100 pushes the lifter ring and lifter rods 98 upward, lifting the lifting bracket 78 and stopper tube 68 to raise the stopper tube to the open position. As shown by hidden lines in FIG. 4, the stop ring 122 has angularly elongated slots 123 in it which permit passage of gases from the growth chamber G through the stop ring to the pulling chamber P as the crucible C is being charged with semiconductor material. The lift ring 100, which engages a gasket (not shown) around the upper end of the isolation valve V, is sufficiently spaced at its inner diameter from the sleeve 24 to permit gas to flow from the growth chamber G to the pulling chamber P between the lift ring and the sleeve as charging occurs. However, when the lift ring 100 engages the stop ring 122 integrally attached to the sleeve 24, the fluid communication between the chambers would be substantially blocked but for the provision of the slots 123.

A second embodiment of the hopper, indicated generally by the reference numeral 124, is shown in FIG. 9. In place of the stopper tube 68 of the first embodiment of the hopper 20 is a conical stop 125 made of quartz and sized for closing the opening 30 at the lower end of the liner 26. A stainless steel actuator rod 126 extends upward from the conical stop 125 to the top plate 46' of the cap 28 of the hopper 124 where it is received in a cup-shaped retainer 127 attached to the top plate in a cavity 128. The top plate 46' differs from the top plate 46 of the first embodiment by having a central opening. The connector 50' of the second embodiment differs from the first embodiment by being constructed to define the cavity 128. The upper end of the actuator rod 126 is held by a spring 129 engaging a nut 130 at the upper end of the rod and bearing against the bottom of the cup-shaped retainer 127. In the liner 26, the actuator rod 126 passes through a central tube 131 made of quartz or other suitable material which will protect the semiconductor source material from contamination. The central tube 131 is fixedly attached to the liner by three sets of three mounting quartz rods (each rod designated by reference numeral 132) fused at one end to the central tube 131 and at the other end to the inside of the liner 26. The mounting rods 132 are spaced at 120° intervals around the central tube 131, although only two rods 132 in each set may be seen in FIG. 9.

The lower end of the actuator rod 126 just above the conical stop 125 is received in a quartz sheath 133 fused to and extending upwardly from the conical stop. The sheath 133 protects the semiconductor material from contact with the actuator rod 126 as the actuator rod extends from the central tube 131 to unseat the conical stop 125. A collar 134 affixed to the actuator rod 126 above the sheath 133 is engageable with the sheath for forcing the sheath and conical stop 125 down with downward motion of the actuator rod.

Three rods 135 (only one is shown) on the exterior of the sleeve 24 guide the movement of the cap 28. The rods 135 are each attached at their upper ends to the cap 28 and slidably received through the guide rings 104o Springs 136 on each rod 135 between the guide rings 104 engage the lower of the two guide rings and a stop 137 on the rod to absorb any impact if the cap 28 were suddenly dropped toward the sleeve 24. To increase the stability of the guide rings 104, they are fixedly connected by three posts 138 (only one is shown) the ends of which are received in the holes 140 of the guide rings (FIG. 7). The holes 140 are not employed in the first embodiment. The operation of the hopper 124 will be described in more detail below.

The hopper 20 of the present invention may be transported by a carrier, shown in FIGS. 10 and 11 of the drawings and indicated generally by the reference numeral 144, The carrier 144 includes a base 146, wheels 148 mounted on the base, a hopper support column 150 extending upwardly from the base, and a handle assembly 152 also extending upwardly from the base. The hopper support column 150 is received at its lower end in an upstanding tube 154 of a bracket (generally indicated at 156) attached by bolts 156 to the base 146. The tube 154 is strengthened by the addition of gussets 158 on either side of the tube. Nearer the top of the support column 150, a hopper support bracket 160 includes a generally U-shaped projection 162 extending forwardly from the support column 150 and sized for receiving the sleeve 24 of the hopper between the arms of the projection. The hopper support ring 102 rests on the projection 162, and two pins 164 (FIG. 12) fixedly attached to the projection are received in corresponding openings 166 in the hopper support ring so that the hopper 20 is securely held on the hopper support bracket 160. The handle assembly 152 includes a grip portion 168 which is held by an operator for pushing the carrier 144 from location to location as desired. The handle assembly 152 is reinforced by braces 170 (only one is shown), and a tray 172 is mounted at the rear end of the base 146 for holding other items which may be required by the operator.

The hopper 124 is also capable of transport by way of the carrier 144. However, the hopper 124 is supported by engagement of the underside of the lower guide ring 104 on the projection 162 of the hopper support bracket 160. The pins 164 are mounted on the lower guide ring. The projection 162 holds up the cap 28 by engagement with the lower ends of the rods 135 to maintain the conical stop 125 in a closed position.

Having described the construction of the preferred embodiments of the hoppers 20, 124 of the present invention, their beneficial assistance in the operation of a crystal pulling apparatus A will now be described. On start up, the melt of semiconductor source material in the crucible C is formed by stacking solid semiconductor source material in the crucible. Heating elements (not shown) are activated to melt the solid source material. The solid semiconductor source material is usually in the form of blocks because of their heat transfer characteristics during melt down of the source material. A source material such as polycrystalline silicon can be more inexpensively made in the form of small pellets (called "fluid bed polycrystalline silicon" because of the method of their production). However, these pellets have generally not been adequate for forming the initial melt because of their poor heat transfer characteristics.

An ingot (not shown) of monocrystalline semiconductor material is grown by the Czochralski method in the crystal pulling apparatus A in a way which is well known in the art. When the ingot is completed, it is pulled up by the pull wire W until the ingot is located entirely within the pulling chamber P. The isolation valve V is operated to seal the growth chamber G from the pulling chamber P and the pulling chamber is brought to substantially room conditions. The pulling chamber P is opened to the exterior of the crystal pulling apparatus A and the ingot is removed for further processing. Typically, at this point the quantity of the melt remaining in the crucible C in the growth chamber G is insufficient to grow a second monocrystal.

The hopper (20, 124) is filled with semiconductor source material, preferably in the pellet form of fluid bed polycrystalline silicon which will flow out of the hopper when it is later opened. To fill the hopper (20, 124) the cover plate 62 is turned to align its openings 64 with the openings 58 the top plate (46, 46') of the cap 28. A funnel (not shown) is inserted through one pair of aligned openings 58, 64 and semiconductor source material is poured into the hopper through the funnel. The other three aligned openings (58, 64) of the cover plate 62 and top plate (46, 46') permit gases (and dust) on the interior of the hopper (20, 124) to be exhausted as the semiconductor source material is poured in.

The operator pushes the carrier 144 holding the filled hopper (20, 124) to the crystal pulling apparatus A. The seed crystal chuck (not shown) normally on the lower end of the pull wire W is replaced with a hanger assembly generally indicated at 174. The hopper (20, 124) is inserted into the crystal pulling chamber P and hung in the pulling chamber by receiving a portion of the hanger assembly 174 through the eyelets 56 at the top of the hopper. The operator inspects the hopper and pulling chamber P and performs any necessary cleaning. The pulling chamber P is closed and sealed from the environment exterior of the crystal pulling apparatus A, and conditions compatible with the environment in the growth chamber G are re-established. Typically, this involves several purges of the pulling chamber to rid it of contaminants (e.g., air), and a reduction in pressure from atmospheric to that of the growth chamber G. The isolation valve is reopened to expose the growth chamber G to the crystal pulling chamber P.

To begin charging the crucible, the winch mechanism in the winch housing WH is activated to lower the hopper (20, 124) toward the growth chamber G. The lower portion of the hopper passes through the isolation valve V and into the growth chamber G, as shown in FIG. 1. In the first embodiment of the hopper 20, the lift ring 100 engages the upper end of the isolation valve V and is prohibited from further downward motion with the hopper 20. Thus, the isolation valve V provides a reaction surface for the stopper actuating mechanism 74. As the hopper continues to move downward, the lift ring 100 pushes up the lifter rods 98 and lifts the lifting bracket 78 holding the stopper tube 68. The arms 88 of the lifting bracket 78 are permitted to move upwardly relative to the hopper 20 in the vertically elongated slots 90 in the cap 28. Once the beveled lower end 72 of the stopper tube 68 is unseated from the wall of the liner 26, the source material flows out of the hopper 20 and into the crucible C where it is melted to replenish the melt. It has been found that source material in the form of pellets will melt satisfactorily under the conditions where there is existing melted material in the crucible C.

In the second embodiment of the hopper 124, the hopper moves down until the stop ring 122 engages the isolation valve V, so that the weight of the sleeve 24 and liner 26 is wholly supported by the crystal pulling apparatus A. As more of the pull wire W is let out the weight of the cap 28 and the semiconductor source material against the conical stop 125 pushes the actuator rod 126 and conical stop downward causing the conical stop to become unseated from the liner 26 around the opening 30. Semiconductor source material then flows through the opening 30 between the conical stop 125 and liner 26 to the crucible C.

After the charge of semiconductor source material in the hopper is released into the crucible, the winch mechanism is reactivated to reel in the pull wire W and raise the hopper 20 back into the pulling chamber P. The isolation valve V is closed to again seal the growth chamber G and the conditions of the pulling chamber P are brought to those of the room. The pulling chamber P is opened to the exterior of the crystal pulling apparatus A, and the hopper (20, 124) is removed to its carrier 144. The hopper may be refilled and used on another crystal pulling apparatus (not shown) in the room. Thus, one hopper is capable of servicing several crystal pulling apparatus. The seed crystal chuck is again placed on the end of the pull wire W, and the crystal pulling apparatus is ready to grow another monocrystal.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A hopper for use in charging semiconductor source material to a crucible of a crystal pulling apparatus which produces monocrystals by the Czochralski method, the crystal pulling apparatus including a pulling chamber, a growth chamber, an isolation valve operable to seal the growth chamber from the pulling chamber, and a crucible in the growth chamber, a hopper being sized and shaped for reception in the crystal pulling apparatus, the hopper comprising a bin constructed for containing a quantity of semiconductor source material, the bin having an opening in its bottom for delivery of the semiconductor source material from the bin to the crucible, a stopper constructed for closing the opening to prohibit passage of semiconductor source material from the bin, a stopper actuating mechanism for moving the stopper between a closed position and an open position, and a connector attached to the hopper constructed for temporarily mounting the hopper in the crystal pulling apparatus.

2. A hopper as set forth in claim 1 wherein the hopper is sized and shaped for reception entirely within the pulling chamber of the crystal pulling apparatus whereby the hopper may be inserted into and removed from the pulling chamber while maintaining the environment of the growth chamber by sealing the growth chamber with the isolation valve.

3. A hopper as set forth in claim 2 wherein the stopper actuating mechanism is operable to move the stopper to the open position upon engagement with the crystal pulling apparatus, the crystal pulling apparatus providing a reaction surface and the weight of at least a portion of the hopper providing the force to operate the stopper actuating mechanism for moving the stopper to the open position.

4. A hopper as set forth in claim 3 wherein the stopper actuating mechanism comprises an engagement member operable to engage the crystal pulling apparatus, a bracket holding the stopper and a linkage interconnecting the bracket and the engagement member to transmit the force applied to the engagement member upon engagement with the crystal pulling apparatus for lifting the bracket to move the stopper to the open position.

5. A hopper as set forth in claim 4 wherein the engagement member comprises a ring extending around the exterior of the bin, the ring being sized for engaging the isolation valve.

6. A hopper as set forth in claim 3 wherein the connector is constructed for connection to a pull wire of the crystal pulling apparatus such that the hopper is supported by the pull wire in the crystal pulling apparatus, the hopper being adapted to be lowered by letting out the pull wire to bring the stopper actuating mechanism into engagement with the crystal pulling apparatus.

7. A hopper as set forth in claim 1 wherein the bin comprises a generally tubular, rigid sleeve having open upper and lower ends, a liner disposed substantially within the sleeve, the liner being made of a material which will not contaminate the semiconductor source material, and a cap adapted to cover the open upper end of the sleeve, the cap having at least one opening therein for loading semiconductor source material into the bin and a cover plate operable to selectively cover the opening.

* * * * *